(12) United States Patent
DeLoach et al.

(10) Patent No.: US 8,546,259 B2
(45) Date of Patent: Oct. 1, 2013

(54) NICKEL SILICIDE FORMATION FOR SEMICONDUCTOR COMPONENTS

(75) Inventors: Juanita DeLoach, Plano, TX (US); Jiong-Ping Lu, Richardson, TX (US); Haowen Bu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 643 days.

(21) Appl. No.: 11/861,421

(22) Filed: Sep. 26, 2007

(65) Prior Publication Data
US 2009/0079010 A1    Mar. 26, 2009

(51) Int. Cl.
*H01L 21/44*    (2006.01)
(52) U.S. Cl.
USPC .................................. 438/682; 257/E21.296
(58) Field of Classification Search
USPC ........................................................ 438/682
See application file for complete search history.

(56) References Cited

U.S. PATENT DOCUMENTS

| | | | |
|---|---|---|---|
| 5,051,856 A * | 9/1991 | Narishige et al. | 360/125.33 |
| 6,180,469 B1 * | 1/2001 | Pramanick et al. | 438/299 |
| 7,365,010 B2 | 4/2008 | Rhee et al. | |
| 2005/0158996 A1 * | 7/2005 | Kim et al. | 438/664 |
| 2006/0154411 A1 * | 7/2006 | Bu et al. | 438/184 |
| 2008/0041716 A1 * | 2/2008 | Alpay et al. | 204/192.2 |
| 2008/0131735 A1 * | 6/2008 | Das et al. | 428/831 |
| 2008/0224317 A1 * | 9/2008 | Machkaoutsan et al. | 257/754 |

OTHER PUBLICATIONS

Alloy definition: http://www.merriam-webster.com/dictionary/alloy.*
O. Nakatsuka, Y. Tsuchiya, A. Sakai, S. Zaima, J. Murota, and Y. Yasuda. Improvement in Morphology of Nickel Silicide Film with Carbon. Extended abstracts of International Worshop on Junction Technology 2002. ISBN: 4-89114-028-3/029-1.*

\* cited by examiner

*Primary Examiner* — Chuong A Luu
*Assistant Examiner* — Cory Eskridge
(74) *Attorney, Agent, or Firm* — Alan A. R. Cooper; W. James Brady, III; Frederick J. Telecky, Jr.

(57) ABSTRACT

Semiconductor components are often fabricated that include a nickel silicide layer, e.g., as part of a gate electrode in a transistor component, which may be formed by forming a layer of nickel on a silicon-containing area of the semiconductor substrate, followed by thermally annealing the semiconductor substrate to produce a nickel silicide. However, nickel may tend to diffuse into silicon during the thermal anneal, and may form crystals that undesirably increase the sheet resistance in the transistor. Carbon may be placed with the nickel to serve as a diffusion suppressant and/or to prevent nickel crystal formation during thermal annealing. Methods are disclosed for utilizing this technique, as well as semiconductor components formed in accordance with this technique.

34 Claims, 5 Drawing Sheets

NICKEL SILICIDE FORMATION FOR SEMICONDUCTOR COMPONENTS

FIELD

The present disclosure relates generally to the field of semiconductor component fabrication, and more particularly to the formation of a carbon-containing nickel silicide layer, such as for the gate electrode of a transistor component.

BACKGROUND

The present disclosure relates generally to the field of semiconductor fabrication. In conventional practice, semiconductor fabrication begins with the provision of a semiconductor wafer, comprising silicon formed in a regular, crystalline structure. A circuit pattern is devised in which regions of the semiconductor wafer are intended to support NMOS and PMOS semiconductor components. These regions are isolated from each other with the formation of electronically inert isolation trenches. Each region is then doped with a type of dopant opposite the electronic nature of the components to be created thereupon. The formation of the electronic components then occurs upon this semiconductor wafer, and typically involves doping the electronically active areas of the semiconductor wafer with the desired type of dopant. For instance, NMOS components are formed by implanting a p-type dopant in a region of the semiconductor, and then forming the components by implanting an n-type dopant in order to create the electronically active regions of the NMOS component. A conductive gate may be formed spanning the electrically active areas, generally comprising a dielectric, such as a silicon oxide, over which is formed a gate electrode, such as a gate silicon layer (e.g., polycrystalline silicon) topped with a nickel silicide layer. An additional layer of dielectric may be formed over the component for electrical isolation from other components. The transistor gate may then be interconnected with other components during a metallization step, in which metal paths are formed to connect the electronically active areas of the components into a fully interconnected circuit.

Figure 1:
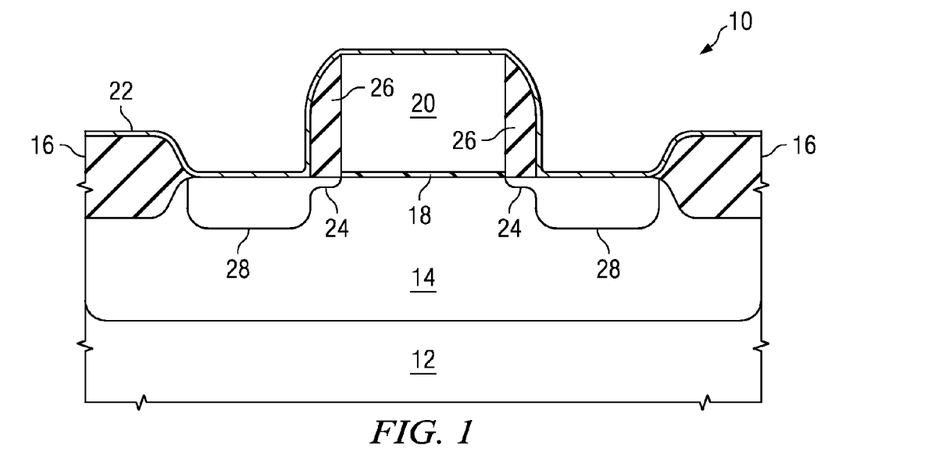
FIG. 1 is a side view in section illustrating a semiconductor component formed on a semiconductor substrate.

The concepts described hereinabove are illustrated in FIG. 1, which presents a side view in section of a portion of a conventional semiconductor device. In this figure, the semiconductor device 10 comprises a silicon wafer 12, an area of which is designated to support either n-type or p-type electronic components. For an area intended to support NMOS components, the semiconductor substrate (an upper layer 14 of the silicon wafer 12) is doped with a p-type dopant, which will electronically insulate the NMOS components to be fabricated thereupon. Conversely, for an area intended to support PMOS components, the semiconductor substrate 14 is doped with an n-type dopant, which will electronically insulate the PMOS components to be fabricated thereupon. The area may also be electronically insulated from nearby structures by the formation of one or more isolation structures 16, such as a local oxidation of silicon (LOCOS) structure or an isolation trench. To form an electronic component like a transistor, a gate structure is formed, comprising, in one common design, a layer of dielectric material 18 over which is formed a gate silicon layer 20, such as polycrystalline silicon. Sidewall spacers 26 are formed adjacent to the gate silicon layer 20, where the region of the semiconductor substrate 14 under the sidewall spacers 26 will become a lightly doped source/drain extension region 24, which will contain a comparatively small amount of dopant. The regions 28 of the semiconductor substrate 14 adjacent to the gate structures 18, 20 and the sidewall spacers 26 are heavily doped with a dopant of the same type as the components to be formed. The regions 28 will function as the source and drain regions of the transistor. After the dopant implantations, the semiconductor 10 is exposed to a high temperature anneal, which "activates" the dopant ions implanted in the lightly-doped source/drain extension regions 24 and source/drain regions 28 by causing them to migrate into the crystalline structure of the silicon wafer 12, and also restores the regular lattice configuration of the silicon wafer 12 for consistent electronic flow.

Following the activation of the dopant, a nickel layer 22 is formed over the gate 18, 20 and at least one of the active areas 28. A second anneal is then performed that causes the nickel layer 22 to react with the silicon in the gate silicon layer 20 and in the semiconductor substrate 14 comprising the source and drain regions 28 to form a nickel silicide layer, which affords high conductance to the transistor gate 20 and the source and drain regions 28. Because nickel diffuses rapidly in silicon, the silicide forming anneal is often performed at a comparatively lower temperature than the dopant activating anneal in order to limit undesirable nickel diffusion from the nickel layer 22. The completion of these steps results in a functional NMOS or PMOS transistor.

SUMMARY

The following presents a simplified summary of the disclosure in order to provide a basic understanding of some aspects of the disclosure. This summary is not an extensive overview of the disclosure. It is intended neither to identify key or critical elements of the disclosure nor to delineate the scope of the disclosure. Rather, its primary purpose is merely to present one or more concepts of the disclosure in a simplified form as a prelude to the more detailed description that is presented later.

The exemplary transistor formed above comprises, in part, a gate electrode structure comprising a nickel silicide layer formed on a gate silicon layer, such as a layer of polycrystalline silicon. The nickel silicide layer may be formed by forming a nickel layer (e.g., as a layer of nickel metal, a nickel alloy, etc.) and exposing the semiconductor substrate to a thermal anneal, which causes the nickel to react with the silicon in the gate silicon layer and in the regions comprising the source and drain regions to form a nickel silicide layer over the gate and over the source and drain regions. However, the thermal anneal may adversely affect the nickel in at least two ways. First, nickel is capable of rapid diffusion in silicon at high temperatures, and the thermal anneal may cause some of the nickel to diffuse into the silicon, thereby reducing the nickel comprising the nickel silicide layer. Second, nickel silicide is capable of agglomerating at high temperatures, such as may be applied to the semiconductor substrate during the thermal anneal. Larger nickel silicide crystalline grains exhibit a lower conductance than smaller nickel silicide crystalline grains, and may cause an increase in the sheet resistance in the transistor gate and the source and drain regions. These properties adversely affect the performance of the transistor component and alter the electrical properties of the resulting circuit. Similarly, disadvantageous properties may arise in a nickel silicide layer formed in any semiconductor component in this manner.

One technique for improving the performance of semiconductor components relates to the placement of carbon with nickel in the formation of a nickel silicide layer. Carbon may serve as a nickel diffusion suppressant by slowing the rate of diffusion of nickel into silicon during thermal annealing. Carbon may also mitigate the formation of large nickel silicon crystals during thermal annealing by raising the agglomeration temperature. The resulting nickel silicide layer may therefore exhibit a more consistent low resistivity, and therefore a reduced sheet resistance. The use of these techniques to form, e.g., a nickel silicide layer in a transistor gate, may enable the fabrication of more consistent and higher-performance semiconductor components To the accomplishment of the foregoing and related ends, the following description and annexed drawings set forth in detail certain illustrative aspects and implementations of the disclosure. These are indicative of but a few of the various ways in which one or more aspects of the present disclosure may be employed. Other aspects, advantages and novel features of the disclosure will become apparent from the following detailed description of the disclosure when considered in conjunction with the annexed drawings.

DETAILED DESCRIPTION

One or more aspects of the present disclosure are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present disclosure. It may be evident, however, to one skilled in the art that one or more aspects of the present disclosure may be practiced with a lesser degree of these specific details. In other instances, well-known structures and devices are shown in block diagram form in order to facilitate describing one or more aspects of the present disclosure.

Figure 2A:
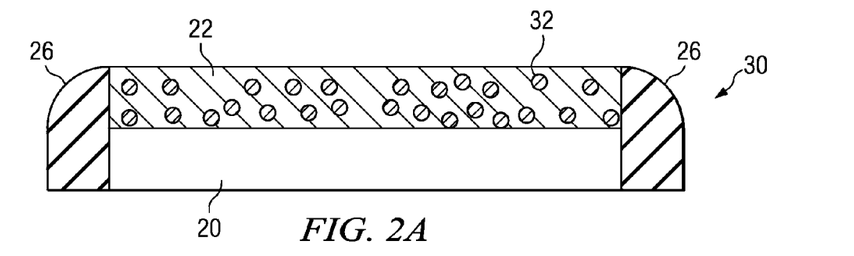
FIGS. 2A-2C are side views in section illustrating portions of different semiconductor components formed on semiconductor substrates.
Figure 2B:
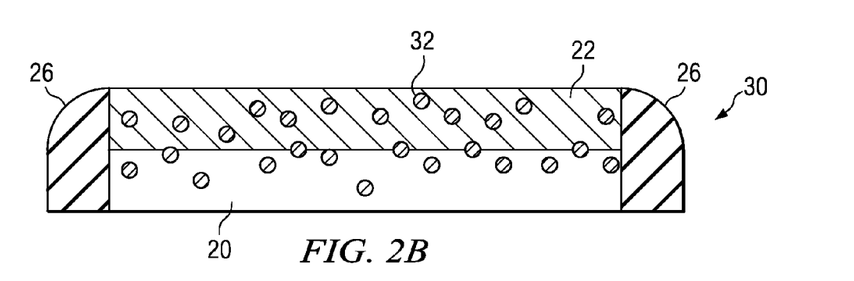

As noted hereinabove, the present disclosure relates to the formation of a nickel silicide layer in a semiconductor component, such as in a transistor gate structure or a source or drain region. A nickel silicon layer may be so formed by forming a nickel layer on a layer containing silicon, such as polycrystalline silicon, and subsequently exposing the semiconductor substrate to a thermal anneal, which causes the nickel to react with the silicon and form a nickel silicide. FIG. 2B illustrates a portion of the transistor component 10 of FIG. 1, wherein the illustrated portion 30 comprises a portion of a gate silicon layer 20, a nickel layer 22 formed over the gate silicon layer 20, and a portion of a sidewall spacer 26. The nickel layer 22, comprising nickel particles 32, is intended to be annealed to form the nickel silicide layer.

Figure 2C:
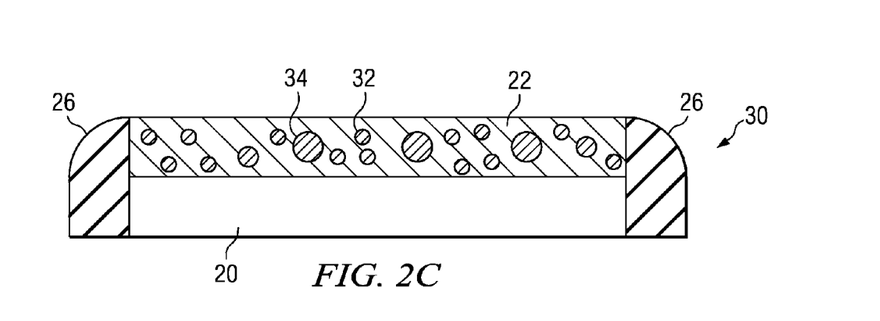

However, at least two properties of nickel may reduce the chemical transformation of nickel to nickel silicide. First, some of the nickel in the nickel layer may be lost due to diffusion into silicon during the thermal anneal at high temperatures. FIG. 2B illustrates this result of thermally annealing the semiconductor substrate, in which some of the nickel atoms 32 comprising the nickel layer 22 have diffused into the gate silicon layer 20, thereby reducing the amount of reacted nickel silicide forming in the nickel layer 22. Second, nickel silicide may agglomerate at the high temperatures applied to the semiconductor substrate during the thermal anneal, and larger crystalline grains of nickel silicide may form during the anneal that present a less desirable conductance in the nickel silicide layer than smaller crystalline grains of nickel silicide. FIG. 2C illustrates this result of thermally annealing the semiconductor substrate, in which some of the nickel silicide atoms 32 have formed larger nickel silicide grains 34. Due to one or both of these factors, nickel silicide layers formed in this manner may form incompletely, unpredictably, or with undesirable electrical properties, such as uneven conductance or higher sheet resistance.

Figure 3:
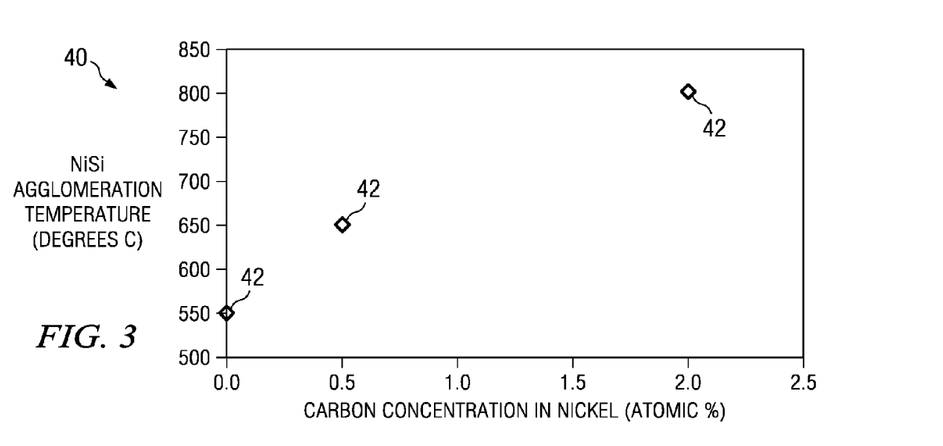
FIG. 3 is a graphical representation of the effect of the presence of carbon on nickel silicide agglomeration temperature in an exemplary method of forming a nickel silicide layer over a semiconductor substrate in accordance with the present disclosure.

It has been discovered that incorporating carbon with deposited nickel in forming a nickel silicide layer may be advantageous for at least two reasons. First, the carbon serves as a nickel diffusion suppressant, which reduces the loss of nickel through diffusion into silicon at high temperatures. Accordingly, the nickel deposited to form a nickel silicide layer may remain more highly concentrated, and may form a more consistent nickel silicide layer through thermal annealing. Second, it has been discovered that carbon raises the agglomeration temperature of nickel silicide. The presence of carbon with nickel during thermal annealing reduces the degree of nickel silicide crystallization in the nickel silicide layer, thereby reducing the sheet resistance caused thereby and improving the consistency and conductance of the nickel silicide layer. FIG. 3 presents a graphical representation 40 that illustrates this finding as a relationship of the concentration of carbon in the nickel layer with the observed agglomeration temperature of nickel silicide. The data points 42 of FIG. 3 illustrate an approximately linear relationship between the concentration of carbon (expressed as an atomic concentration of carbon with respect to the atomic concentration of nickel) and the corresponding agglomeration temperature of nickel silicon. It will be appreciated from an examination of FIG. 3 that an approximately linear relationship is presented, wherein the inclusion of carbon at increasing concentrations raises the agglomeration temperature of nickel silicide, thereby resulting in a lower degree of nickel silicide agglomeration at a given anneal temperature (e.g., at the temperature chosen for performing the thermal anneal of the silicidation.)

Figure 4:
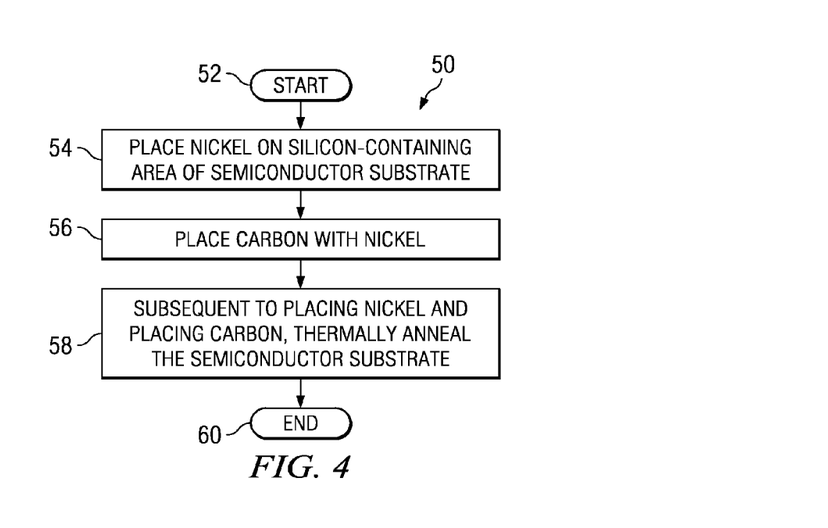
FIG. 4 is a flow diagram illustrating an exemplary method of forming a transistor on a semiconductor substrate in accordance with the present disclosure.

In light of these properties of carbon in conjunction with nickel, an alternative technique for forming a nickel silicide layer is illustrated in FIG. 4, which presents an exemplary method of forming a nickel silicide layer over a semiconductor substrate. The method 50 begins at 52 and involves forming a nickel layer on a silicon-containing area of the semiconductor substrate 54. The silicon-containing area may comprise a region of the silicon-based semiconductor substrate, or a silicon-containing layer formed over the semiconductor substrate (e.g., a polycrystalline silicon layer in a transistor gate structure.) The method 50 also involves placing carbon with the nickel 56. Some techniques for forming the nickel layer 54 and the carbon 56 are discussed hereinbelow. The method 50 also involves, subsequent to forming the nickel layer 54 and placing the carbon 56, thermally annealing the semiconductor substrate 58. Having formed the nickel layer and placed carbon with the nickel on a layer of silicon and having annealed the semiconductor substrate, the method 50 yields a nickel silicide layer, and therefore the method 50 ends at 60.

Figure 5:
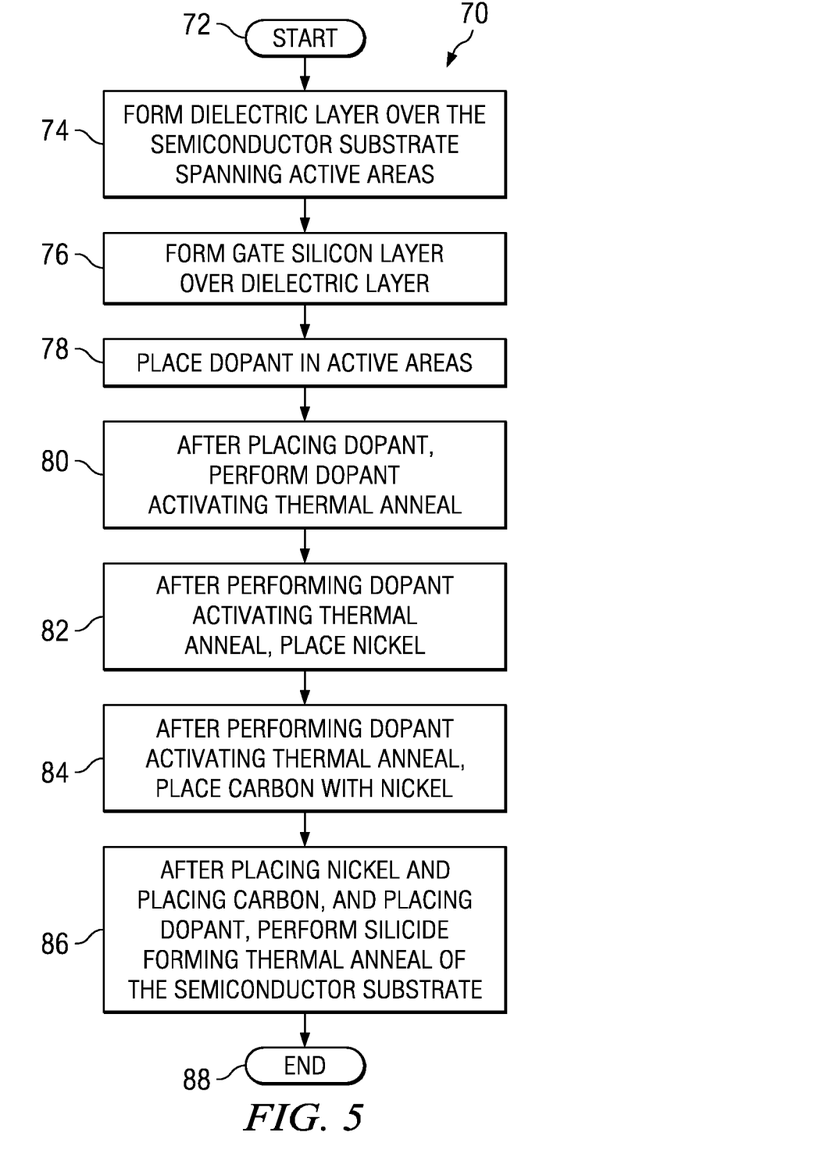
FIG. 5 is a flow diagram illustrating an exemplary method of forming a semiconductor on a semiconductor substrate in accordance with the present disclosure.

More specifically, this technique may be used to form a transistor or similar semiconductor component having a nickel silicide layer. FIG. 5 illustrates an exemplary method 70 of forming a transistor having a gate spanning a plurality of active areas on a semiconductor substrate. The method 70 begins at 72 and involves forming a dielectric layer over the semiconductor substrate spanning the active areas 74. The dielectric layer may comprise, e.g., a silicon dioxide layer, which may be formed such as by epitaxial growth, in which the silicon of the semiconductor substrate is exposed to oxygen or water vapor and subjected to high temperature. The method 70 also comprises forming a gate silicon layer over the dielectric layer 76. The gate silicon layer may be formed, e.g., directly on the dielectric layer, or may be formed over the dielectric layer with one or more intermediating layers, such as an etch-stop nitride layer. The method 70 also comprises placing a dopant in the active areas 78, and after placing the dopant, performing a dopant activating thermal anneal 80. The dopant activating thermal anneal 80 often requires a high anneal temperature that would undesirably promote the diffusion of deposited nickel into silicon. Accordingly, after performing the dopant activating thermal anneal 80, the method 70 comprises forming a nickel layer 82, and also placing carbon with the nickel 84. As will be discussed herein below, several techniques may be used to place the carbon with the nickel 84. After forming the nickel layer and placing the carbon with the nickel, the method 70 involves performing a silicide forming thermal anneal of the semiconductor substrate 86. The silicide forming thermal anneal 86 is often performed at a lower temperature than the dopant activating thermal anneal so as to form the silicide layer without unduly promoting nickel diffusion into the silicon or deactivating the dopant. Having formed a gate spanning a plurality of active areas, the method 60 thereby produces a semiconductor transistor, and so the method 70 ends at 88.

Methods embodying these techniques, such as the exemplary method 50 of FIG. 4 and the exemplary method 70 of FIG. 5, may be performed in many variations while adhering to the principles discussed herein. As one example, the order of the elements of each method need not follow the linear depiction of exemplary methods 50 and 70. For instance, the exemplary method 70 of FIG. 5 may be performed by placing the dopant in the active areas 78 before or simultaneously with forming some of the gate structures 74, 76. As another exemplary variation of the method 70 of FIG. 5, the carbon may be placed 84 simultaneously with forming the nickel layer 82, e.g., by sputtering a nickel-containing material simultaneously with sputtering a carbon-containing material, or may be performed after forming the nickel layer 82, e.g., by ion implantation of carbon into the nickel layer. It will be appreciated that those of ordinary skill in the art may be able to devise many variations of the methods discussed herein that operate in accordance with the techniques discussed herein.

FIGS. 6A-6F together illustrate the formation of a transistor on a semiconductor substrate formed in accordance with the techniques described herein. The portion 94 of the semiconductor substrate 90 is doped with a dopant of a conductivity type which is opposite to the type of dopant to be used in the semiconductor device formed thereupon; e.g., if this portion 94 is to host an NMOS-type device, the portion 94 may be doped with a P-type dopant to electrically insulate the doped regions. Also, the portion 94 may be electrically insulated from adjacent portions, such as by the formation of an isolation structure 96. The planning of the transistor is in part illustrated in FIG. 6A, wherein the transistor 90 is formed on a portion 94 of a semiconductor substrate 92. The process starts with the selection of regions of the portion 94 of the semiconductor substrate 92 that will comprise the source and drain regions 98 and the lightly doped source and drain extension regions 100. (At this stage, nothing has yet been done to the illustrated portion 94 of the semiconductor substrate 92; this stage simply illustrates the designated area of the semiconductor substrate 92 on which the transistor will be formed.) The devised source and drain regions 98 are devised with some lateral displacement, and the region between the devised source and drain regions 98 will comprise the channel of the transistor, over which a gate will be formed spanning the source and drain regions 98 to induce conductance through the channel. The active areas 98 may, but need not, include an adjacent lightly doped area 100, which will be lightly and shallowly doped with the dopant placed in the active areas 98 and underlaps the transistor gate, in order to confer more consistent and predictable electrical conductance through the channel.

Figure 6A:
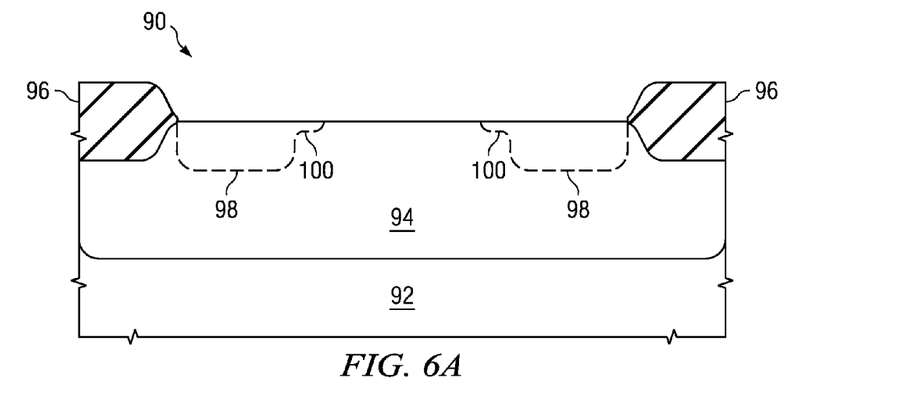
FIGS. 6A-6F are side views in section illustrating various steps in the fabrication of a semiconductor component including a transistor formed in accordance with the present disclosure.
Figure 6B:
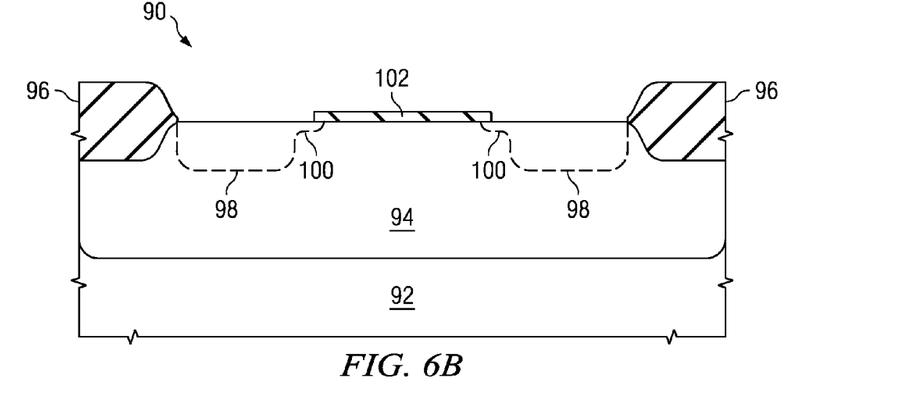
Figure 6C:
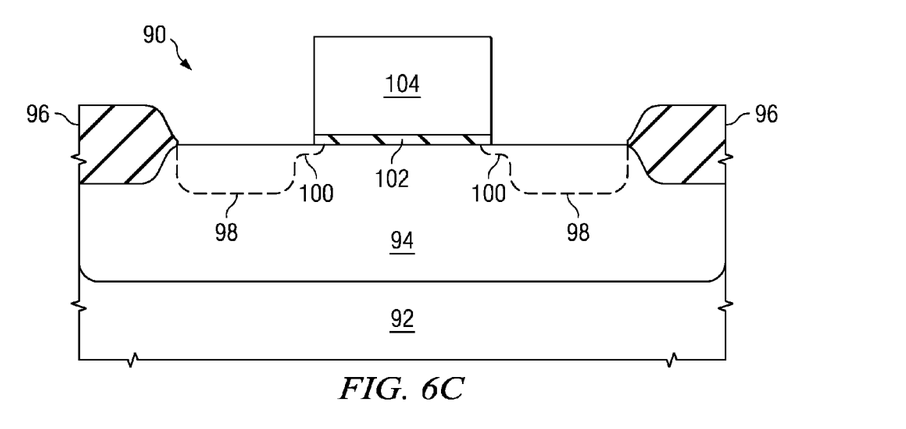

FIG. 6B illustrates the first element in the formation of the transistor, comprising the formation of a dielectric layer 102 on the semiconductor substrate 92 between the designated source and drain regions 98. The dielectric layer 102 serves to insulate the channel region between the source and drain regions 98 (and over which the dielectric layer 102 is formed) from the electric current that may be passed through the gate structure of the fully formed transistor. FIG. 6C illustrates the next element in the formation of the transistor, comprising the formation of a gate silicon layer 104 over the dielectric layer 102. The gate silicon layer may be formed, e.g., by physical vapor deposition of polycrystalline silicon. The gate electrode can be defined by conventional patterning and etch processes.

Figure 6D:
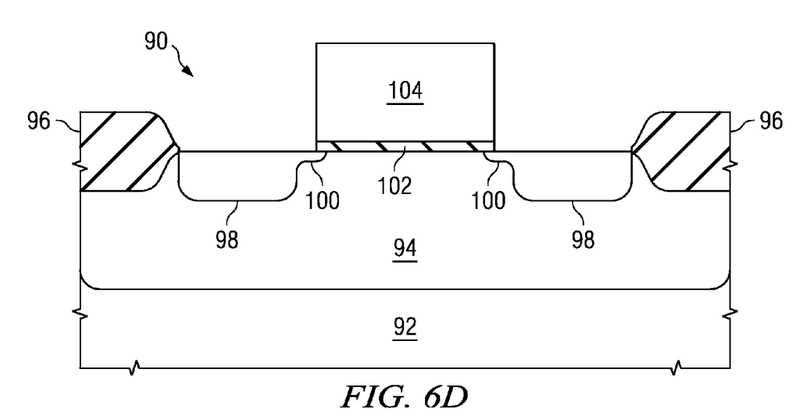

The formation continues in FIG. 6D, which illustrates the doping of the source and drain regions 98. The dopants may be placed into the intended source and drain regions 98 through many methods, e.g., with a conventional ion implantation process. If lightly doped source and drain extension regions 100 are desired, a sidewall spacer structure (not shown in FIGS. 6A-6F, but such as illustrated as 26 in FIG. 1) may be formed adjacent to the gate electrode after forming the shallow source drain extension region 100, which will shield the lightly doped source and drain extension regions 100 during placement of the dopant in the source and drain regions 98. Furthermore, if desired, the sidewall spacers may be selectively removed following doping of the source and drain regions 98. After the dopant has been placed, a dopant activating thermal anneal is performed to activate the dopants implanted and repair the lattice damages in silicon caused by the implantation processes. This thermal anneal is often performed at a fairly high temperature, and may involve a very fast heating step followed by a very brief anneal duration, such as in a rapid thermal anneal, in order to achieve a high degree of dopant activation without deactivating the dopant through overexposure or unduly promoting undesirable diffusion of the dopant out of the source and drain regions 98.

Figure 6E:
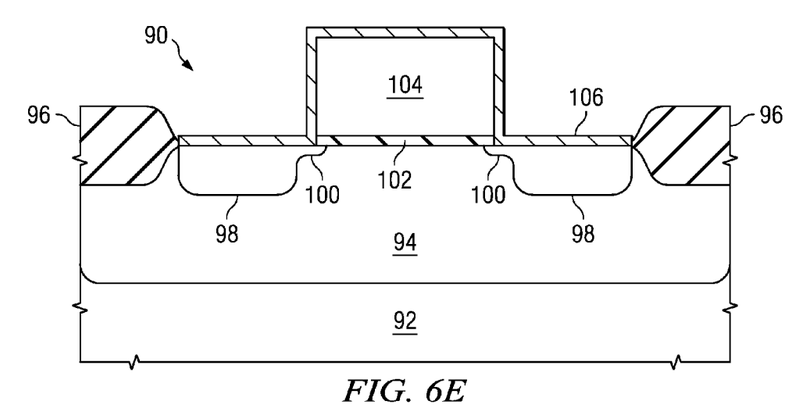

Following the dopant activating thermal anneal, FIG. 6E illustrates the formation of a nickel layer 106 over the gate silicon layer 104 and the source and drain regions 98. The nickel layer 106 may be formed by many techniques. As one example, a nickel-containing material (e.g., nickel metal or a nickel alloy) may be sputter-deposited on the gate silicon layer 104 and the source and drain regions 98. As another example, nickel may be deposited by physical vapor deposition on the gate silicon layer 104 and the source and drain regions 98. Other techniques may be devised and utilized for forming the nickel layer 106 on the gate silicon layer 104 and the source and drain regions 98.

Figure 6F:
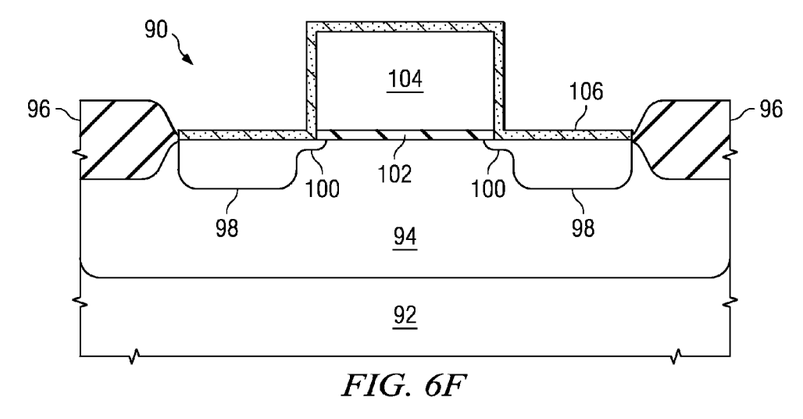

FIG. 6F illustrates the placement of carbon with the nickel layer 106 to form a nickel-carbon layer 108. The concentration of carbon in the carbon-nickel layer 106 is desirably controlled to adjust the agglomeration temperature of the nickel silicide to be subsequently formed. For example, by reference to FIG. 3, if a thermal anneal of 700 degrees Celsius is to be used to form the nickel silicide, the carbon may advantageously be deposited at an atomic concentration of at least approximately 0.5% with respect to the atomic concentration of nickel. Also, the carbon may be placed with the nickel layer 106 to form a carbon-nickel layer 108 according to many techniques. As one example, the carbon may be placed via ion implantation in the nickel layer 106. However, in other embodiments, carbon may be deposited along with nickel, forming the nickel layer 106 containing carbon illustrated in FIG. 6F without passing through an intermediate, nickel-only layer 106, as illustrated in FIG. 6E. As one example of forming a nickel-carbon layer 108, a carbon-containing material (e.g., pure carbon) may be sputter-deposited simultaneously with the nickel-containing material onto the gate silicon layer 104. As another example, a nickel-carbon alloy may be sputter-deposited onto the gate silicon layer 104. As a third example, nickel may be deposited by physical vapor deposition in the presence of a carbon-containing gas, such as methane. Other techniques for forming the nickel-carbon layer 108 may be devised by those of ordinary skill in the art that incorporate the principles discussed herein.

After forming the nickel-carbon layer 108 on the gate silicon layer 104, the semiconductor substrate is again thermally annealed in order to transform the nickel-carbon layer 108 into a nickel silicide layer. As noted, the temperature of the silicide forming thermal anneal may be advantageously devised to enable formation of the silicide layer, while not unnecessarily promoting diffusion of the nickel into the silicon, diffusion of the dopant out of the source and drain regions 98, or thermal deactivation of the dopant. Reference to FIG. 3 may be helpful for devising a silicidation thermal anneal below the agglomeration temperature of nickel silicon. For example, if the carbon is placed with at least an approximately 0.5% atomic concentration with respect to the nickel in the nickel-carbon layer 108, the thermal annealing may be performed by heating the semiconductor substrate to approximately 650 degrees Celsius to reduce the formation and magnitude of nickel silicide crystals. The thermal anneal may be effectuated with various techniques, such as by exposing the semiconductor substrate to a laser, or an arc lamp, or a flash lamp, etc. As a third variation, the thermal anneal may be performed at a variety of temperatures, at different durations, and with different profiles (e.g., various forms of rapid thermal anneal) to produce different results on the components of the transistor.

According to the techniques disclosed herein, the inclusion of carbon with the nickel may advantageously affect the nickel silicidation in either or both of two ways. First, the carbon may reduce the diffusion of nickel from the nickel-carbon layer 108 into the gate silicon layer 104 and into the source and drain regions 98 (including the source and drain extension regions 100) during thermal annealing, thereby causing more nickel to be retained in the nickel-carbon layer 108 and forming a more consistent nickel silicide layer. Second, the carbon may reduce the agglomeration of nickel silicide crystals, and may therefore produce a semiconductor component having a more consistent and higher performance.

The transistor formed in FIG. 6F and subsequently annealed may be subjected to one or more subsequent transformations. As one example, sidewall spacers may be formed adjacent to the transistor gate 102, 104, 108 and over the active areas 98. As another example, an additional layer of dielectric may be formed over the structure illustrated in FIG. 6F in order to electrically insulate the components, and as a physical protector of the device. As a third example, the nickel silicide 108 may be metallized in a subsequent metallization step (e.g., by forming contact vias through the additional dielectric layer, and filling the contact vias with a conductive metal), and the contact vias may be interconnected with those of other components to form an integrated circuit. However, it will be appreciated that the structures formed as illustrated in FIG. 6F and subjected to an activating thermal anneal will be sufficient to form a transistor in accordance with the techniques discussed herein, comprising a plurality of active areas comprising doped areas of the semiconductor substrate; a dielectric layer formed over the semiconductor substrate spanning the active areas; a gate silicon layer formed over the dielectric layer; and a nickel silicide layer containing carbon formed over at least one of the gate silicon layer and at least one of the active areas.

Although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (assemblies, elements, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, "exemplary" as utilized herein merely means an example, rather than the best.

What is claimed is:

1. A method of forming a semiconductor device, comprising: depositing nickel on a silicon-containing area of a semiconductor substrate;
    incorporating carbon throughout the nickel simultaneously with or after depositing the nickel, to form a nickel-carbon layer in contact with the silicon-containing area;
    thermally reacting the nickel in the nickel-carbon layer with the silicon-containing area to form nickel silicide within the deposited nickel, thereby transforming the nickel-carbon layer in its entirety into a composite layer of carbon and nickel silicide, and
    increasing an agglomeration temperature of the nickel silicide due to thermally reacting the nickel with the silicon-containing area in a presence of the carbon.

2. The method of claim 1, wherein the semiconductor device includes a transistor having a gate spanning a plurality of active areas on the semiconductor substrate, and the method includes:
   forming a dielectric layer over the semiconductor substrate spanning the active areas;
   forming a gate silicon layer over the dielectric layer;
   placing a dopant in the active areas;
   after placing the dopant, performing a dopant activating thermal anneal of the semiconductor substrate;
   after performing the dopant activating thermal anneal, forming the nickel-carbon layer in contact with at least the gate silicon layer; and
   after forming the nickel-carbon layer, thermally reacting the nickel in the nickel-carbon layer with silicon of at least the gate silicon layer to form the nickel silicide.

3. The method of claim 1, wherein the nickel-carbon layer is formed by sputtering a carbon-containing material simultaneously with sputtering a nickel-containing material.

4. The method of claim 1, wherein the nickel-carbon layer is formed by sputtering a nickel-carbon alloy.

5. The method of claim 1, wherein the nickel-carbon layer is formed by depositing a nickel layer by physical vapor deposition, and incorporating carbon with nickel throughout the nickel layer simultaneously with or after depositing the nickel layer.

6. The method of claim 1, wherein the nickel-carbon layer is formed by depositing nickel in the presence of a carbon-containing gas.

7. The method of claim 6, wherein the carbon-containing gas comprises methane.

8. The method of claim 1, wherein the nickel-carbon layer is formed by forming a nickel layer; and placing carbon throughout the nickel layer by ion implantation.

9. The method of claim 1, wherein the nickel-carbon layer is formed with an atomic concentration of carbon of at least approximately 0.5% with respect to an atomic concentration of nickel.

10. The method of claim 1, wherein the silicon-containing area is a polycrystalline silicon layer of a transistor gate structure.

11. The method of claim 10, wherein the gate structure spans a plurality of active areas on the semiconductor substrate.

12. The method of claim 11, wherein the method further comprises:
   forming a dielectric layer over the semiconductor substrate spanning the active areas;
   forming a gate silicon layer comprising the polycrystalline silicon layer over the dielectric layer;
   implanting dopant in the active areas; and
   after implanting the dopant and prior to forming the nickel-carbon layer, performing a dopant activating thermal anneal.

13. The method of claim 12, wherein thermally reacting the nickel with the silicon-comprising area comprises a thermal anneal performed at a lower temperature than the dopant activating thermal anneal.

14. The method of claim 1, wherein forming the carbon-nickel layer comprises depositing a nickel-containing material simultaneously with depositing a carbon-containing material.

15. A method of forming a semiconductor device, comprising: providing a semiconductor substrate; forming a gate dielectric layer over the semiconductor substrate; forming a gate silicon layer over the gate dielectric layer; patterning the gate silicon layer to form a gate electrode;
   implanting dopant into source and drain regions of the semiconductor substrate adjacent the gate electrode;
   performing a dopant activating thermal anneal to activate the implanted dopant; after performing the dopant activating thermal anneal, forming a nickel-carbon layer having an atomic concentration of carbon of at least approximately 0.5% with respect to the an atomic concentration of nickel in contact with at least one of silicon of the gate electrode or silicon of the source and drain regions;
   performing a silicide-forming thermal anneal to react nickel of the nickel-carbon layer with the silicon of the at least one of the gate electrode or source and drain regions to transform the nickel-carbon layer in its entirety into a composite layer of carbon and nickel silicide; and
   increasing an agglomeration temperature of said nickel silicide due to thermally reacting the nickel with the silicon-containing area with employment of the carbon.

16. The method of claim 15, wherein the silicide-forming thermal anneal is conducted at a temperature of approximately 650° C.

17. The method of claim 15, wherein forming the nickel-carbon layer comprises forming a nickel layer; and placing carbon throughout the nickel layer by ion implantation.

18. The method of claim 15, wherein forming the nickel-carbon layer comprises depositing carbon simultaneously with depositing nickel.

19. The method of claim 18, wherein depositing the carbon simultaneously with depositing the nickel comprises simultaneously sputter depositing a carbon-containing material and a nickel-containing material.

20. The method of claim 18, wherein depositing the carbon simultaneously with depositing the nickel comprises depositing nickel in the presence of a carbon-containing gas.

21. The method of claim 18, wherein depositing the carbon along simultaneously with depositing the nickel comprises depositing the nickel by physical vapor deposition in the presence of a hydrocarbon gas.

22. A method of forming a semiconductor device, comprising:
   forming a nickel layer in contact with a silicon-containing area of a semiconductor substrate;
   placing carbon throughout the nickel layer to form the nickel layer into a nickel-carbon layer;
   subsequent to forming the nickel layer and placing the carbon, performing a silicide-forming thermal anneal to transform the nickel-carbon layer into a composite layer of carbon and nickel silicide; and
   increasing an agglomeration temperature of said nickel silicide due to thermally reacting the nickel with the silicon-containing area with employment of the carbon.

23. The method of claim 22, including performing a dopant activating thermal anneal prior to forming the nickel layer and placing carbon with the nickel, wherein the silicide-forming anneal is performed at a lower temperature than the dopant activating thermal anneal.

24. The method of claim 22, wherein the carbon is placed with the nickel simultaneously with forming the nickel layer.

25. The method of claim 24 wherein the nickel-carbon layer is formed by at least one of sputtering a nickel-containing material simultaneously with sputtering a carbon-containing material, by sputter-depositing a nickel alloy onto a gate silicon layer, or by depositing nickel by physical vapor deposition in the presence of methane, wherein methane is a carbon-containing gas.

26. The method of claim 22, wherein the carbon is placed with the nickel by ion implantation of carbon into the nickel layer after forming the nickel layer.

27. The method of claim 22, wherein the nickel layer is formed in contact with a gate silicon layer and with source and drain regions of the semiconductor substrate.

28. The method of claim 22, wherein the silicide-forming thermal anneal is performed at a temperature of approximately 650° C. and the carbon is placed with the nickel at an atomic concentration of at least approximately 0.5% with respect to the atomic concentration of nickel.

29. The method of claim 1, wherein the carbon serves as a nickel diffusion suppressant of the nickel into the silicon-containing area of the semiconductor substrate.

30. The method of claim 15, wherein the carbon serves as a nickel diffusion suppressant of the nickel into the silicon-containing area of the semiconductor substrate.

31. The method of claim 22, wherein in the carbon serves as a nickel diffusion suppressant of the nickel into the silicon-containing area of the semiconductor substrate.

32. The method of claim 1, wherein increasing an agglomeration temperature of said nickel silicide further comprises reducing a degree of nickel silicide crystallization in the composite carbon and nickel silicide layer.

33. The method of claim 15, wherein increasing an agglomeration temperature of said nickel silicide further comprises reducing a degree of nickel silicide crystallization in the composite carbon and nickel silicide layer.

34. The method of claim 22, wherein increasing an agglomeration temperature of said nickel silicide further comprises reducing a degree of nickel silicide crystallization in the composite carbon and nickel silicide layer.

* * * * *